US009468100B2

(12) United States Patent
Otsubo

(10) Patent No.: US 9,468,100 B2
(45) Date of Patent: Oct. 11, 2016

(54) MULTILAYER WIRING SUBSTRATE

(71) Applicant: Murata Manufacturing Co., Ltd., Kyoto (JP)

(72) Inventor: Yoshihito Otsubo, Kyoto (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 0 days.

(21) Appl. No.: 14/325,574

(22) Filed: Jul. 8, 2014

(65) Prior Publication Data

US 2014/0318847 A1  Oct. 30, 2014

Related U.S. Application Data

(63) Continuation of application No. PCT/JP2013/051261, filed on Jan. 23, 2013.

(30) Foreign Application Priority Data

Jan. 27, 2012  (JP) .................................. 2012-015277

(51) Int. Cl.
*H05K 1/11* (2006.01)
*H01L 23/498* (2006.01)
(Continued)

(52) U.S. Cl.
CPC ......... *H05K 1/115* (2013.01); *H01L 23/49822* (2013.01); *H01L 23/49827* (2013.01); *H01L 23/49838* (2013.01); *H05K 1/0271* (2013.01); *H05K 1/0298* (2013.01); *H05K 3/4629* (2013.01); *H01L 2924/0002* (2013.01);
(Continued)

(58) Field of Classification Search
CPC ... H05K 1/0298; H05K 1/115; H05K 1/0271
See application file for complete search history.

(56) References Cited

U.S. PATENT DOCUMENTS

| 5,744,224 A | 4/1998 | Takeuchi |
| 6,429,517 B1 | 8/2002 | Kirloskar |

(Continued)

FOREIGN PATENT DOCUMENTS

| JP | H06-69652 A | 3/1994 |
| JP | 06-130408 A | 5/1994 |

(Continued)

OTHER PUBLICATIONS

International Search Report issued in Application No. PCT/JP2013/051261 dated Apr. 23, 2013.
(Continued)

*Primary Examiner* — Hoa C Nguyen
*Assistant Examiner* — Stanley Tso
(74) *Attorney, Agent, or Firm* — Pearne & Gordon LLP

(57) ABSTRACT

A multilayer wiring substrate is provided which is less apt to cause the warping and the degradation of the surface flatness, and which is able to effectively suppress the occurrence of cracks. A multilayer wiring substrate 1 includes a substrate body 2 in which a plurality of wirings 5a are disposed to extend from a first principal surface 2a toward a second principal surface 2b. The wiring 5a or 5b includes via conductors 6a and 8a disposed respectively in at least two insulator layers in which the wiring is disposed, a wiring conductor 7a connecting the via conductor 6a, which is disposed in one 2c of the insulator layers adjacent to each other in a stacking direction of the insulator layers, and the via conductor 8a disposed in the other insulator layer 2d, the wiring conductor 7a having a nonlinear shape.

19 Claims, 12 Drawing Sheets

(51) Int. Cl.
*H05K 1/02* (2006.01)
*H05K 3/46* (2006.01)

(52) U.S. Cl.
CPC ............ *H01L2924/15174* (2013.01); *H05K 2201/09227* (2013.01); *H05K 2201/09272* (2013.01); *H05K 2201/09709* (2013.01)

(56) References Cited

U.S. PATENT DOCUMENTS

| | | |
|---|---|---|
| 6,483,714 B1 * | 11/2002 | Kabumoto et al. ............ 361/760 |
| 2004/0023011 A1 | 2/2004 | Sumi |
| 2005/0184393 A1 | 8/2005 | Hirakawa |
| 2008/0225463 A1 * | 9/2008 | Takashima et al. ........ 361/306.3 |
| 2009/0011201 A1 | 1/2009 | Ikeda |
| 2010/0053388 A1 * | 3/2010 | Kobayashi et al. .......... 348/294 |
| 2010/0097775 A1 | 4/2010 | Kashiwazaki |

FOREIGN PATENT DOCUMENTS

| | | |
|---|---|---|
| JP | H06-244552 A | 9/1994 |
| JP | 08-153823 A | 6/1996 |
| JP | H09-69687 A | 3/1997 |
| JP | H09-293723 A | 11/1997 |
| JP | 11-176870 A | 7/1999 |
| JP | 11-233944 A | 8/1999 |
| JP | 2000-124350 A | 4/2000 |
| JP | 2002176236 * | 12/2000 ............... H05K 1/09 |
| JP | 2001-044591 A | 2/2001 |
| JP | 2001-217345 A | 8/2001 |
| JP | 2002-050877 A | 2/2002 |
| JP | 2002-076193 A | 3/2002 |
| JP | 2002-176236 A | 6/2002 |
| JP | 2003-318322 A | 11/2003 |
| JP | 2004-055557 A | 2/2004 |
| JP | 2007-173862 A | 7/2007 |
| JP | 2007-266225 A | 10/2007 |
| JP | 2008-089461 A | 4/2008 |
| JP | 2008-164577 A | 7/2008 |
| JP | 2008-300482 A | 12/2008 |
| JP | 2009-094099 A | 4/2009 |
| JP | 4429760 B2 | 3/2010 |
| JP | 2010-123914 A | 6/2010 |
| JP | 4507012 B2 | 7/2010 |
| JP | 2011-077158 A | 4/2011 |
| JP | 4800186 B2 | 10/2011 |
| JP | 2011-222928 A | 11/2011 |

OTHER PUBLICATIONS

Written Opinion issued in Application No. PCT/JP2013/051261 dated Apr. 23, 2013.
Notice of Dispatch of Notice of Opposition issued in Japanese Patent No. 2015-700035 dated Oct. 22, 2015.

* cited by examiner (a)

(b)

(c)

(a)

(b)

(a)

(b)

(a)

(b)

(a)

(b)

(a)

(b)

(a)

(b)

(c)

MULTILAYER WIRING SUBSTRATE

BACKGROUND OF THE INVENTION

1. Field of the Invention

The present invention relates to a multilayer wiring substrate in which a plurality of wirings, including via conductors and wiring conductors, is formed inside a substrate body.

2. Description of the Related Art

Hitherto, a multilayer wiring substrate has been used as a substrate on which a semiconductor element, such as an IC, is to be mounted. Outer terminals of the semiconductor element are arranged at a higher density with an increasing degree of integration. In view of such a situation, Patent Document 1 and Patent Document 2, given below, disclose multilayer wiring substrates each including a plurality of electrodes formed at a high density on an upper surface thereof on which a semiconductor element etc. are mounted. In those multilayer wiring substrates, a plurality of outer electrodes arranged at a relatively wide pitch is formed on a lower surface of the substrate. Those plural outer electrodes are electrically connected to the plural electrodes on the upper surface side through a plurality of wirings that are disposed inside the multilayer wiring substrate. Each of those wirings includes a plurality of via conductors disposed to penetrate through insulator layers of the multilayer wiring substrate, and a plurality of wiring conductors each electrically connecting the adjacent via conductors, which are disposed in the different insulator layers, at the interface between the insulator layers.

Patent Document 1: Japanese Unexamined Patent Application Publication No. 2008-300482

Patent Document 2: Japanese Unexamined Patent Application Publication No. 2008-164577

BRIEF SUMMARY OF THE INVENTION

In the multilayer wiring substrates disclosed in Patent Document 1 and Patent Document 2, the plural via conductors and the plural wiring conductors both constituting one wiring appear in a certain cross-section as illustrated in FIG. 5 of Patent Document 1, for example. Stated in another way, when looking at the multilayer wiring substrate in a plan view, the plural via conductors and the plural wiring conductors both constituting one wiring are arranged on a linear line. In that type of multilayer wiring substrate, the multilayer wiring substrate tends to warp. Another problem is that the flatness of the upper surface and the lower surface of the multilayer wiring substrate is apt to degrade. Furthermore, when an impact is exerted on the multilayer wiring substrate from the outside, the impact is easily transmitted to the via conductors and the wiring conductors. This raises the problem that the multilayer wiring substrate tends to crack.

An object of the present invention is to provide a multilayer wiring substrate, which is less apt to cause the warping and to degrade the surface flatness, and which can effectively suppress the occurrence of cracks.

The present invention provides a multilayer wiring substrate, which includes a substrate body having first and second principal surfaces, and a plurality of wirings disposed inside the substrate body and extending from the first principal surface toward the second principal surface. According to the present invention, the substrate body includes a plurality of stacked insulator layers. The wirings include a plurality of via conductors penetrating through at least one of the insulator layers, and wiring conductors disposed between the insulator layers and connecting the via conductors to each other. According to the present invention, at least one of the wirings includes the wiring conductor having a nonlinear shape.

In one particular aspect of the multilayer wiring substrate according to the present invention, in all the wirings, the wiring conductors have nonlinear shapes. In this case, the warping of the multilayer wiring substrate and the degradation of the surface flatness thereof can be suppressed more effectively.

In another particular aspect of the multilayer wiring substrate according to the present invention, the wirings are disposed to extend from the first principal surface up to the second principal surface. In this case, the wirings can be easily electrically connected to the outside in the second principal surface.

In still another particular aspect of the multilayer wiring substrate according to the present invention, a distance between the adjacent wirings increases as the wirings extend from the first principal surface toward the second principal surface. In this case, connection of an electronic component, mounted to the first principal surface, to the outside can be more easily established in the second principal surface.

In still another particular aspect of the multilayer wiring substrate according to the present invention, when seeing through the substrate body in a direction perpendicular to the first principal surface, the plural via conductors of the wiring are not positioned on one linear line. In this case, the influence of an impact exerted from the outside can be relieved more effectively. As a result, the occurrence of cracks in the multilayer wiring substrate can be suppressed more effectively.

In still another particular aspect of the multilayer wiring substrate according to the present invention, one of the via conductors and the other via conductor, which are adjacent to each other in one of the insulator layers in a direction parallel to the first principal surface, are connected to the wiring conductors disposed in different ones of the insulator layers. In this case, the plural wirings can be formed inside the multilayer wiring substrate at a higher density.

In particular, when one surface of the one insulator layer defines the first principal surface of the substrate body, the plural wirings can be easily formed inside the multilayer wiring substrate even in the case where the via conductors are arranged at a high density on the side close to the first principal surface.

In still another particular aspect of the multilayer wiring substrate according to the present invention, a plurality of outer-peripheral via conductors on side close to the first principal surface and a plurality of inner-peripheral via conductors on side close to the first principal surface, the inner-peripheral via conductors being disposed in a region surrounded by an outer periphery defined by the outer-peripheral via conductors on side close to the first principal surface, are formed in one of the plural insulator layers, the one insulator layer having one surface defining the first principal surface. When seeing through the substrate body from a direction perpendicular to the second principal surface, a region surrounded by a plurality of outer-peripheral via conductors on side close to the second principal surface, which are positioned at second principal surface-side end portions of the plural wirings including the plural outer-peripheral via conductors on side close to the first principal surface, has a larger area than a region surrounded by the outer periphery defined by the outer-peripheral via conductors on side close to the first principal surface. Moreover, a plurality of inner-peripheral via conductors on side close to the second principal surface, which are positioned at second principal surface-side end portions of the plural wirings including the inner-peripheral via conductors on side close to the first principal surface, are positioned inside the region surrounded by the outer-peripheral via conductors on side close to the second principal surface. In this case, the multilayer wiring substrate is more easily adaptable for an electronic component mounted to the first principal surface even when the electronic component has outer terminals at a higher density.

In still another particular aspect of the multilayer wiring substrate according to the present invention, the wiring conductor includes a first linear portion and a second linear portion that is continuously joined to one end of the first linear portion and that extends in a direction intersecting the first linear portion. In this case, an impact exerted from the outside can be more effectively relieved through the wiring conductor.

In still another particular aspect of the multilayer wiring substrate according to the present invention, the wiring conductor has a curved shape. In this case, the impact exerted on the wiring can be relieved more effectively.

In still another particular aspect of the multilayer wiring substrate according to the present invention, for at least one of the via conductors, a gap is formed between the one via conductor and the insulator layer. In this case, the impact exerted on the multilayer wiring substrate can be relieved through the gap. Accordingly, the occurrence of cracks in the multilayer wiring substrate can be suppressed. In addition, the warping of the multilayer wiring substrate and the degradation of the surface flatness thereof can be suppressed more effectively.

In still another particular aspect of the multilayer wiring substrate according to the present invention, a gap is formed inside at least one of the via conductors. In this case, the impact exerted on the multilayer wiring substrate can be relieved through the gap formed inside the via conductor.

In still another particular aspect of the multilayer wiring substrate according to the present invention, the gap is formed for the via conductor that is positioned at a flexion point of the wiring conductor in a stacking direction of the insulator layers.

In still another particular aspect of the multilayer wiring substrate according to the present invention, in comparison with an area of at least one of the insulator layers which is positioned on side closer to the second principal surface, at least one of the insulator layers, which is positioned on side closer to the first principal surface than the aforesaid at least one insulator layer, has a smaller area. In this case, it is possible to more effectively suppress the warping of the multilayer wiring substrate and the degradation of the surface flatness thereof, which may occur due to a difference in wiring density between both sides including the first principal surface and the second principal surface.

With the multilayer wiring substrate according to the present invention, the wiring formed in the substrate body includes the wiring conductor having the nonlinear shape. It is hence possible to effectively suppress the warping of the multilayer wiring substrate and the degradation of the surface flatness thereof. Moreover, an impact exerted from the outside can be relieved, and the occurrence of cracks in the multilayer wiring substrate can be suppressed effectively.

DETAILED DESCRIPTION OF THE INVENTION

The present invention will be clarified from the following description of practical embodiments of the present invention with reference to the drawings.

Figure 1:
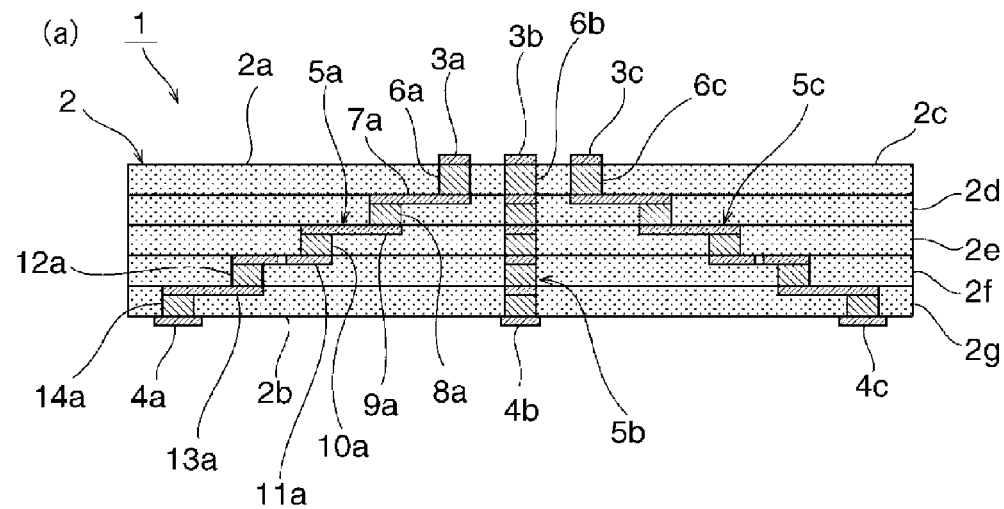
FIG. 1(a) is a schematic front sectional view of a multilayer wiring substrate according to a first embodiment of the present invention.
FIG. 1(b) is a schematic plan view illustrating, in simplified representation, a plurality of wirings formed inside the multilayer wiring substrate according to the first embodiment.
Figure 1:
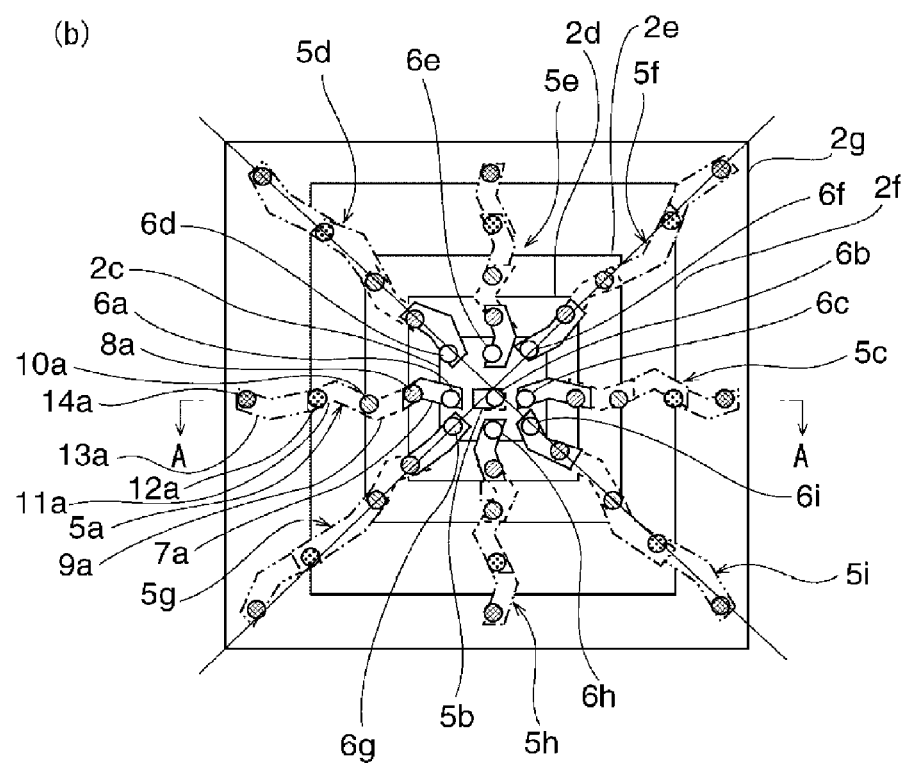

FIG. 1(a) is a schematic front sectional view of a multilayer wiring substrate according to a first embodiment of the present invention, and FIG. 1(b) is a schematic plan view illustrating, in simplified representation, a plurality of wirings formed inside the multilayer wiring substrate.

As illustrated in FIG. 1(a), a multilayer wiring substrate 1 includes a substrate body 2. The substrate body 2 has a first principal surface 2a and a second principal surface 2b that is a surface positioned on the side opposite to the first principal surface 2a. The first principal surface 2a serves as a mount surface on which an electronic component, such as an IC chip, a measurement probe card and so on are mounted. Accordingly, a plurality of electrodes 3a to 3c are formed on the first principal surface 2a.

A plurality of terminal electrodes 4a to 4c are formed on the second principal surface 2b. The plural terminal electrodes 4a to 4c are arranged at a lower density than the plural electrodes 3a to 3c. Because the plural electrodes 3a to 3c are arranged at a higher density, plural terminals of an IC chip or the like, which are arranged at a high density, can be joined to the plural electrodes 3a to 3c. On the other hand, in the second principal surface 2b, the pitch between two adjacent ones of the plural terminal electrodes 4a to 4c is relatively large and electrical connection to the outside can be easily established.

The plural electrodes 3a to 3c are electrically connected to the plural terminal electrodes 4a to 4c, respectively, through a plurality of wirings described later.

The substrate body 2 includes first to fifth insulator layers 2c to 2g. More specifically, the first to fifth insulator layers 2c to 2g are successively laid in a stacked state from the side including the first principal surface 2a of the substrate body 2. The first to fifth insulator layers 2c to 2g are each made of an appropriate insulating material. For example, an insulating ceramic or a synthetic resin may be used as the appropriate insulating material.

In this embodiment, the first to fifth insulator layers 2c to 2g are made of ceramics and co-fired. In other words, the substrate body 2 is constituted by stacking a plurality of ceramic green sheets, and by co-firing the ceramic green sheets.

In this embodiment, the substrate body 2 is made of an LTCC (Low Temperature Co-fired Ceramic). The LTCC can be sintered at a temperature of 1050° C. or lower. Furthermore, the LTCC can be concurrently fired together with Au, Ag or Cu, which has a small specific resistance. Accordingly, wirings having good electrical conductivity can be formed inside the substrate body 2 by firing at a comparatively low temperature. The LTCC can be made of, e.g., a glass composite LTCC material that is prepared by mixing borosilicate glass to ceramic powders of alumina, zirconia, magnesia, forsterite, etc., or a crystallized glass LTCC material using $ZnO$—$MgO$—$Al_2O_3$—$SiO_3$-based crystallized glass. As another example, non-glass LTCC material using $BaO$—$Al_2O_3$—$SiO_2$-based ceramic powder may also be used.

While, in this embodiment, the substrate body 2 is made of the LTCC, the substrate body 2 may be made of suitable one of other ceramic materials, such as alumina and aluminum nitride, which are sintered at a temperature of higher than 1050° C.

While, in this embodiment, the first to fifth insulator layers 2c to 2g are stacked for the sake of convenience in explanation, the number of plural insulator layers stacked in the substrate body 2 is not limited to particular one. Furthermore, the thickness of each of the first to fifth insulator layers 2c to 2g is also not limited to particular one.

The above-described plural electrodes 3a to 3c and plural terminal electrodes 4a to 4c are each made of an appropriate conductive material, e.g., a metal.

A plurality of wirings 5a to 5c is formed inside the substrate body 2 to electrically connect the plural electrodes 3a to 3c to plural terminal electrodes 4a to 4c, respectively.

Taking one wiring 5a of the plural wirings 5a to 5c as a representative example, the structure of the wirings 5a to 5c will be described below. The wiring 5a has an upper end electrically connected to the electrode 3a, and a lower end electrically connected to the terminal electrode 4a. The wiring 5a is formed to extend from the first principal surface 2a up to the second principal surface 2b. In more detail, the wiring 5a includes successively, starting from the side close to the first principal surface 2a, a via conductor 6a, a wiring conductor 7a, a via conductor 8a, a wiring conductor 9a, a via conductor 10a, a wiring conductor 11a, a via conductor 12a, a wiring conductor 13a, and a via conductor 14a. The via conductor 6a, the via conductor 8a, the via conductor 10a, the via conductor 12a, and the via conductor 14a are disposed to penetrate through the first to fifth insulator layers 2c to 2g, respectively. Those via conductors 6a, 8a, 10a, 12a and 14a can be formed, for example, by forming through-holes in the ceramic green sheets that serve to form the first to fifth insulator layers 2c to 2g, and by filling a conductive paste into the through-holes.

While the via conductors 6a, 8a, 10a, 12a and 14a are each illustrated as having a columnar shape, the via conductor may have a cylindrical shape or any other suitable shape, e.g., a prism-like shape.

The wiring conductors 7a, 9a, 11a and 13a electrically connect the via conductors that are adjacent to each other in a stacking direction of the substrate body 2. Taking the wiring conductor 7a as an example, the wiring conductor 7a electrically connects the via conductor 6a disposed in the first insulator layer 2c and the via conductor 8a disposed in the second insulator layer 2d. The wiring conductor 7a is formed at the interface between the first insulator layer 2c and the second insulator layer 2d. In manufacturing, the wiring conductor 7a can be formed by forming a conductive paste on the ceramic green sheet, which severs to form the second insulator layer 2d, with screen printing, for example.

While, in FIG. 1(a), the wiring 5b arranged in a central portion of the substrate body 2 is disposed to extend linearly in a direction perpendicular to the principal surface of the substrate body 2, the shape of the wiring 5b is not limited to the linear shape. The via conductors forming the wiring 5b may be connected to each other through a wiring conductor having a nonlinear shape.

FIG. 1(b) is a perspective view of the substrate body 2, schematically illustrating the plan shapes of plural wirings 5a to 5i formed inside the multilayer wiring substrate 1 according to this embodiment. It is to be noted that FIG. 1(a) illustrates a sectioned end surface, i.e., a cross-section, taken along a line A-A in FIG. 1(b). In other words, FIG. 1(a) illustrates only a cross-section where the wirings 5a to 5c are disposed. In FIG. 1(a), therefore, the above-mentioned via conductors 6a and other via conductors 6b and 6c are illustrated as the via conductors penetrating through the first insulator layer 2c.

In fact, as illustrated in FIG. 1(b), the via conductors 6d to 6i are also exposed in the first principal surface 2a of the substrate body 2 in addition to the via conductors 6a to 6c. Thus, the plural wirings 5a to 5i are formed inside the substrate body 2. The plural wirings 5a to 5i spread radially as they extend from the first principal surface 2a toward the second principal surface 2b. Stated in another way, the pitch between the adjacent wirings is increased gradually as the wirings extend from the first principal surface 2a toward the second principal surface 2b. In FIG. 1(b), the via conductors and the wiring conductors positioned at different levels in height of the substrate body 2 are denoted by different types of hatching, as illustrated, for easier discrimination. In other words, the via conductors and the wiring conductors denoted by the same type of hatching are positioned at the same level in height. Moreover, in FIG. 1(b), outer shapes of the first to fifth insulator layers 2c to 2g are illustrated at different sizes from each other in simplified representation in order that the respective positions of the insulator layers and the interfaces of the insulator layers where the via conductors and the wiring conductors are formed are more clearly understood.

Taking the wiring 5a as an example, the via conductor 6a is exposed in the first insulator layer 2c, and the wiring conductor 7a is positioned at the interface between the first insulator layer 2c and the second insulator layer 2d. Furthermore, the via conductor 8a is disposed to penetrate through the second insulator layer 2d.

Thus, in this embodiment, all of the plural wirings 5a to 5i do not appear at the same sectioned end surface at a cross-section of the substrate body 2. When looking at the substrate body 2 in a plan view, the plural wirings 5a to 5i are distributed radially with respect to the via conductor 6b positioned at a center of a region defined by the via conductors 6a to 6i, which are arranged in a matrix-like pattern. Accordingly, the warping of the substrate and the degradation of the flatness of the substrate body 2 are less likely to occur due to the difference in the contraction behaviors when the wirings 5a to 5i and the substrate body 2 are fired.

Figure 2:
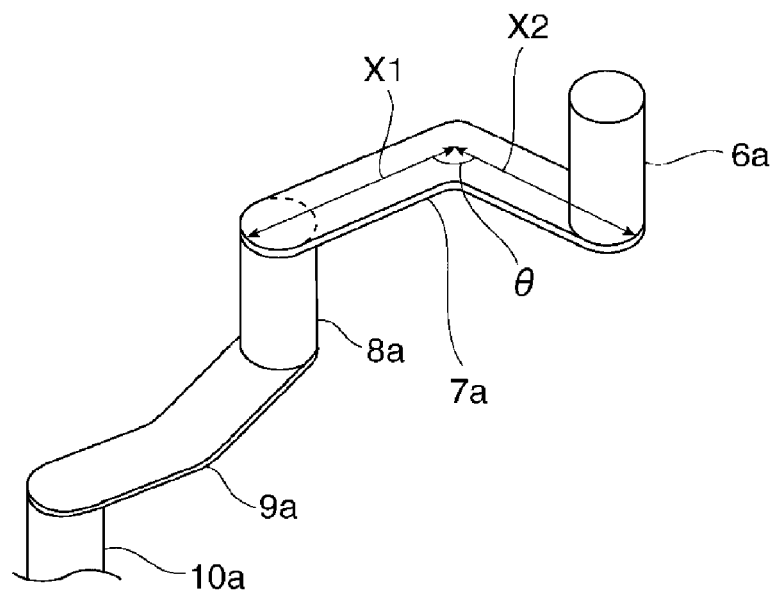
FIG. 2(a) is a perspective view illustrating, in an enlarged scale, a principal part of the wiring formed inside the multilayer wiring substrate in the first embodiment.
FIGS. 2(b) and 2(c) are plan views illustrating the modifications of the wiring conductor.
Figure 2:
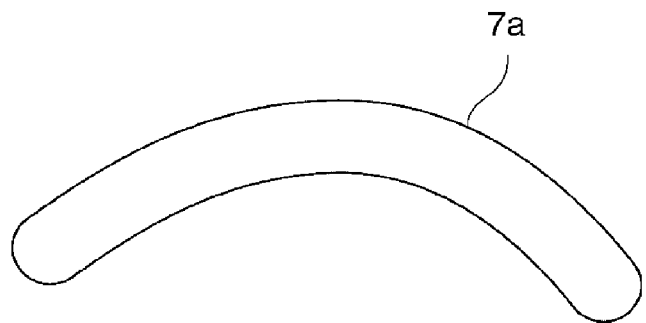
Figure 2:
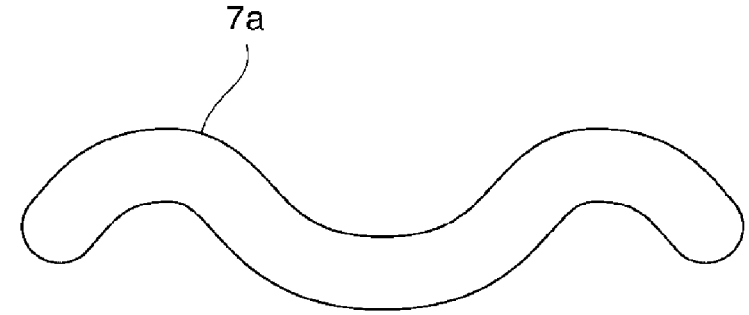

Another feature of this embodiment resides in that each of the wiring conductors 7a, 9a, 11a and 13a has a nonlinear plan shape. FIG. 2 illustrates, in an enlarged scale, a portion of FIG. 1(b) where the wiring conductor 7a and 9a are disposed. As illustrated in FIG. 2, the wiring conductor 7a electrically connects the via conductor 6a and the via conductor 8a, which are adjacent to each other in the stacking direction of the substrate body 2. Here, the wiring conductor 7a does not linearly connect the via conductor 6a and the via conductor 8a to each other. In other words, the wiring conductor 7a has a nonlinear shape. More specifically, in this embodiment, the wiring conductor 7a has a shape defined by a linear portion X1 and a linear portion X2, which intersect at an angle θ as illustrated in simplified representation in FIG. 2. The angle θ is set to a value of less than 180°. Similarly, the wiring conductor 9a also has a nonlinear shape.

Furthermore, as seen from FIG. 1(b), in any of the plural wirings 5a to 5i, the wiring conductor has a nonlinear shape similarly to the wiring conductor 7a.

Accordingly, even when stress is exerted on the via conductor 6a, for example, from a terminal of an external device that is joined to or contacted with the first principal surface 2a, the exerted stress is relieved through the wiring conductors 7a, 9a, 11a and 13a each having the nonlinear shape. If each of the wiring conductors has a linear shape, stress exerted on the via conductor at the first principal surface is linearly transmitted to the second principal surface.

In contrast, in this embodiment, since each of the wiring conductors 7a, 9a, 11a and 13a has the nonlinear shape, the above-mentioned transmission of the stress can be suppressed effectively. Accordingly, warping can be effectively suppressed which may otherwise occur due to the stress exerted in actual use or with the change of the temperature. It is also possible to effectively suppress not only the degradation of the surface flatness, but also the occurrence of cracks. In this embodiment, particularly, taking the wiring 5a as an example, the wiring 5a extending from the via conductor 6a to the via conductor 14a has a zigzag plan shape. Therefore, the above-mentioned stress can be relieved more effectively. That point is similarly applied to the other wirings 5b to 5i.

Thus, according to this embodiment, since the plural wirings 5a to 5i are arranged to be gradually spaced apart from each other as they extend from the first principal surface 2a toward the second principal surface 2b and each wiring conductor has the nonlinear shape as described above, the warping of the substrate body 2 and the degradation of the surface flatness thereof can be suppressed effectively. Hence the occurrence of cracks in actual use can also be suppressed effectively.

While, in FIG. 2, the linear portion X1 and the linear portion X2 continuously extend with the angle θ formed therebetween, the wiring conductor 7a may have any other suitable shape, e.g., a curved shape as illustrated in FIG. 2(b) or a meander shape as illustrated in FIG. 2(c), insofar as the shape of the wiring conductor is nonlinear.

Figure 3:
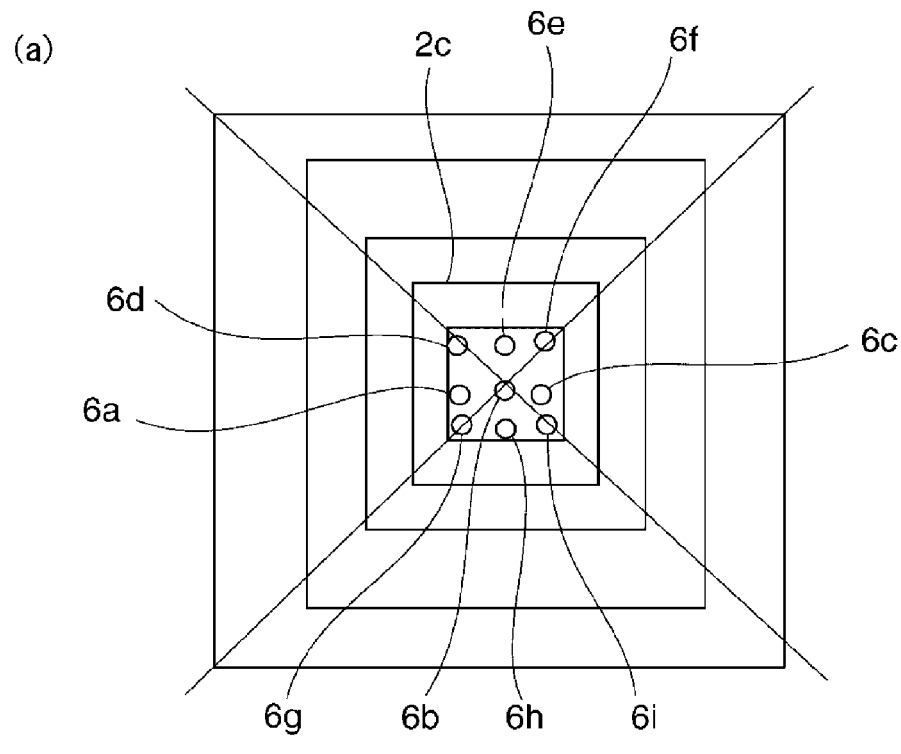
FIGS. 3(a) and 3(b) are each a schematic plan view to explain the arrangement of the wirings in the multilayer wiring substrate according to the first embodiment.
Figure 3:
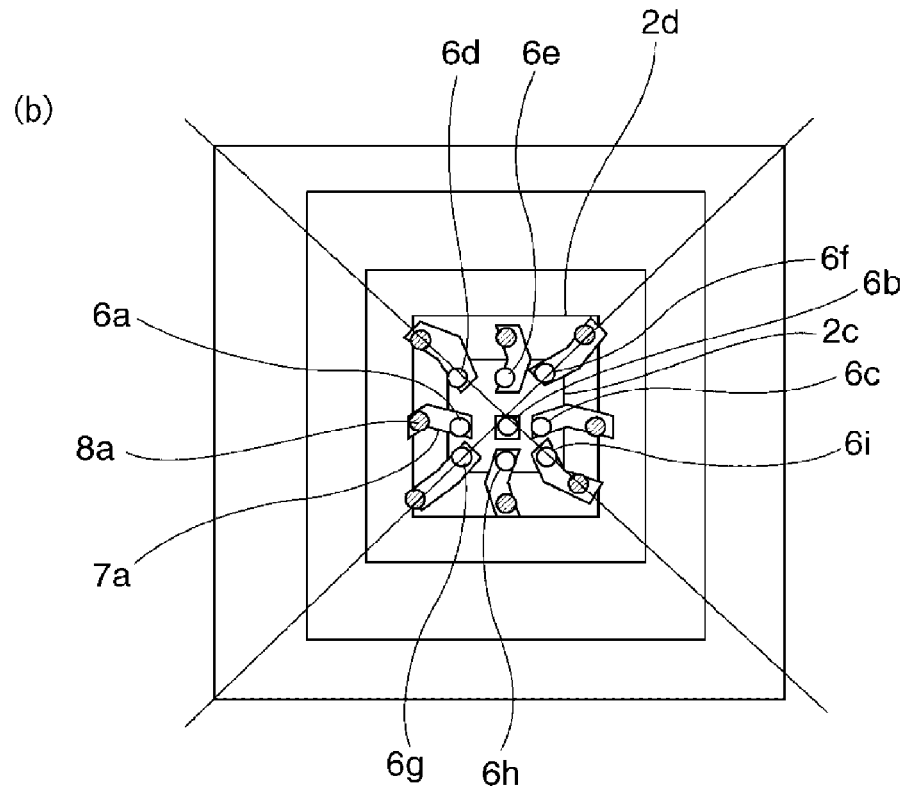
Figure 4:
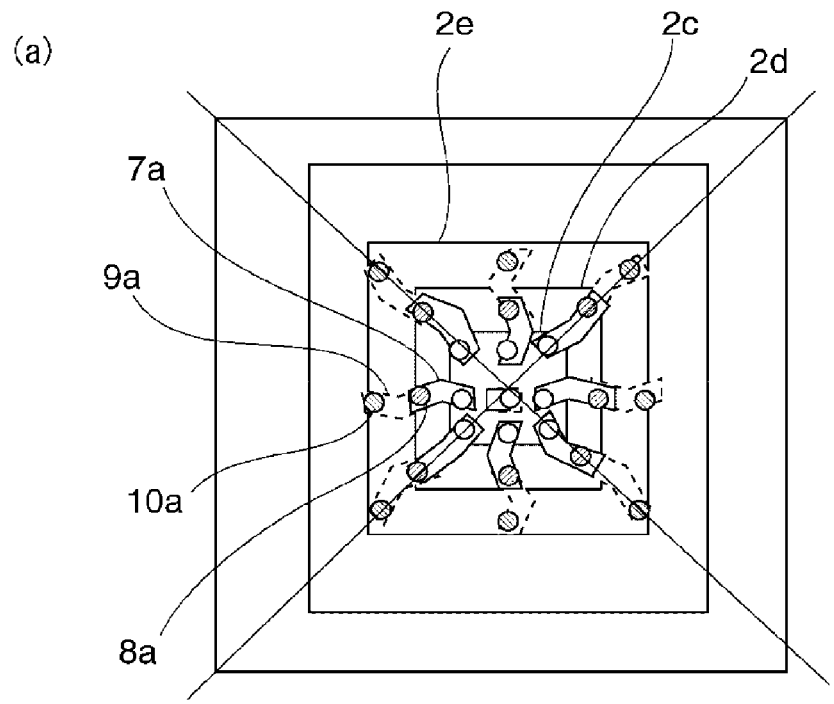
FIGS. 4(a) and 4(b) are each a schematic plan view to explain the arrangement of the wirings in the multilayer wiring substrate according to the first embodiment.
Figure 4:
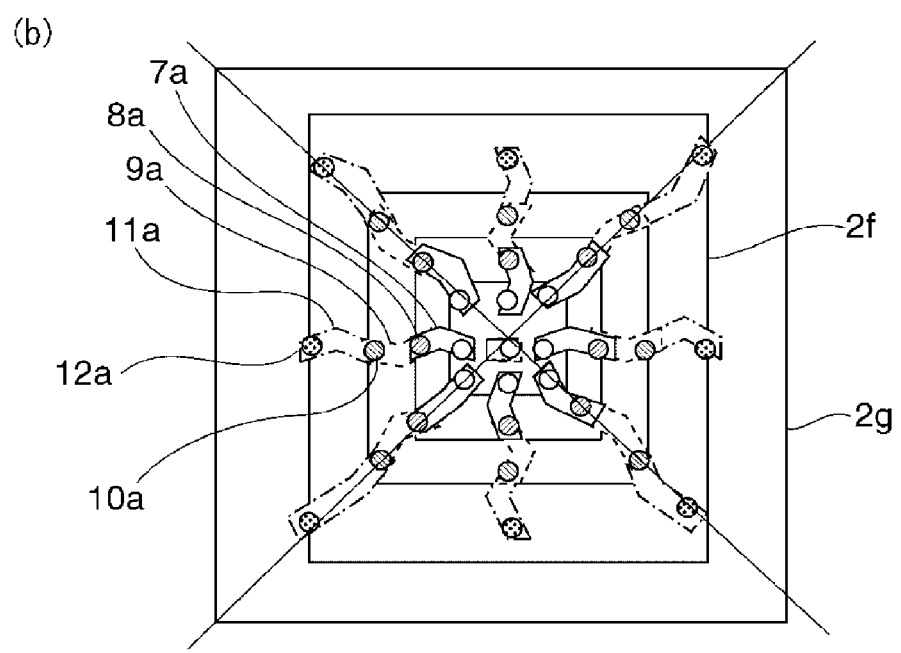

When manufacturing the substrate body 2, the first to fifth insulator layers 2c to 2g are stacked in order and then co-fired. One example of a manufacturing process will be described below with reference to FIGS. 3(a) and 3(b) and FIGS. 4(a) and 4(b). A first ceramic green sheet including the via conductors 6a to 6i formed thereon, as illustrated in FIG. 3(a), is prepared. It is to be noted that, in FIG. 3(a), the first insulator layer 2c is illustrated as having a smaller outer shape than the actual size for the sake of easier understanding. In fact, the outer shape of the first insulator layer 2c has the same size as those of the second to fifth insulator layers.

The following description is made by referring to only portions constituting the wiring 5a as a representative example.

A ceramic green sheet constituting the second insulator layer 2d, which includes the wiring conductor 7a and the via conductor 8a, is stacked at a lower surface of the first insulator layer 2c, as illustrated in FIG. 3(b). Then, the third insulator layer 2e including the wiring conductor 9a and the via conductor 10a is stacked as illustrated in FIG. 4(a). Furthermore, the fourth insulator layer 2f is stacked as illustrated in FIG. 4(b). Finally, the fifth insulator layer 2g is stacked, and the stacked insulator layers are co-fired.

While FIGS. 3(a) and 3(b) and FIGS. 4(a) and 4(b) illustrate the process of stacking the first to fifth insulator layers 2c to 2g in that order, the actual manufacturing may be carried out by stacking the respective ceramic green sheets, which constitute the fourth insulator layer 2f, the third insulator layer 2e, the second insulator layer 2d, and the first insulator layer 2c, on the lowermost fifth insulator layer 2g in order reversed to the above-mentioned case, and by co-firing the stacked insulator layers.

Figure 5:
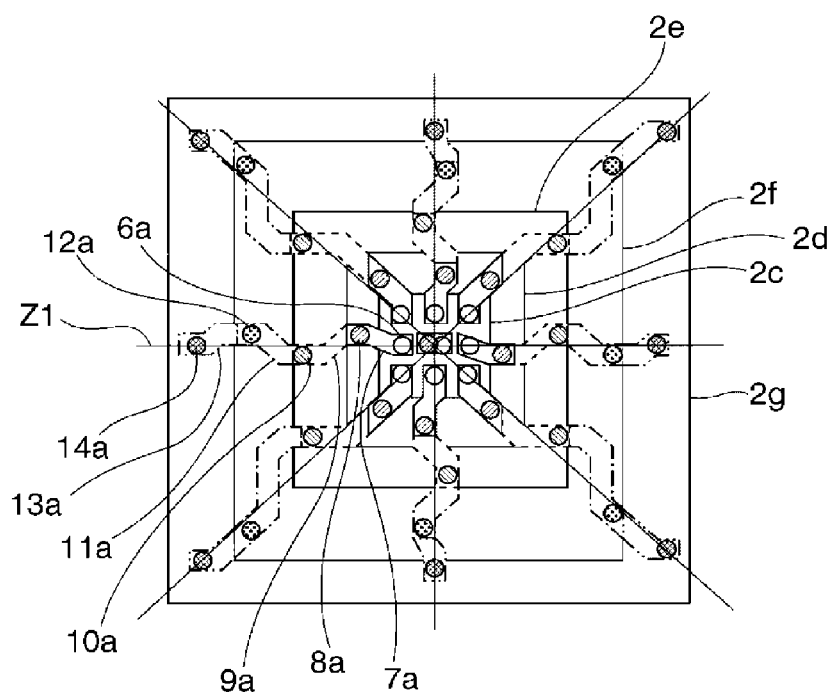
FIG. 5 is a schematic plan view of a substrate body, the view illustrating, in simplified representation, a plurality of wirings in a multilayer wiring substrate according to a modification of the first embodiment.

FIG. 5 is a schematic plan view of a substrate body, the view illustrating, in simplified representation, a plurality of wirings in a multilayer wiring substrate according to a modification of the first embodiment. In this modification, when interconnecting a center of the via conductor 6a on the side close to the first principal surface and a center of the via conductor 14a on the side close to the second principal surface by a linear line Z1, respective centers of the via conductors 8a, 10a and 12a positioned between the via conductors 6a and 14a are not positioned on the linear line Z1. More specifically, the via conductors 8a, 10a and 12a are positioned in a state deviated to opposite sides of the linear line Z1. In particular, the via conductors 8a, 10a and 12a are arranged to be alternately positioned on one side and the other side of the linear line Z1. With such an arrangement, the plan shape of the wiring conductor is zigzagged to a larger extent than in the first embodiment. Hence the stress exerted on the via conductor 6a can be relieved even more effectively. Thus, it is not necessary to arrange the plural via conductors constituting one wiring on one linear line. It is rather more desirable that those via conductors are arranged in a nonlinear shape.

For the other wirings 5b to 5i, when interconnecting the via conductors 6b to 6i positioned on the side close to the first principal surface 2a and the via conductors positioned on the side close to the second principal surface 2b by linear lines, respective intermediate via conductors are similarly positioned in a state alternately deviated to opposite sides of the linear lines. As a matter of course, for all the wirings 5a to 5i, it is not necessary that the intermediate via conductors are positioned in the state alternately deviated to opposite sides of the linear lines interconnecting the via conductors 6a to 6i positioned on the side close to the first principal surface 2a and the via conductors positioned on the side close to the second principal surface 2b.

While, in the first embodiment, all the wiring conductors in each of the wirings 5a to 5i have the nonlinear shapes, it is not necessary that all the wiring conductors of one wiring have the nonlinear shapes. In other words, one or more wiring conductors may have a linear shape.

Furthermore, it is not necessary that all the wirings 5a to 5i include nonlinear wiring conductors. In other words, it is just required that at least one wring includes the wiring conductor having the nonlinear shape.

Figure 6:
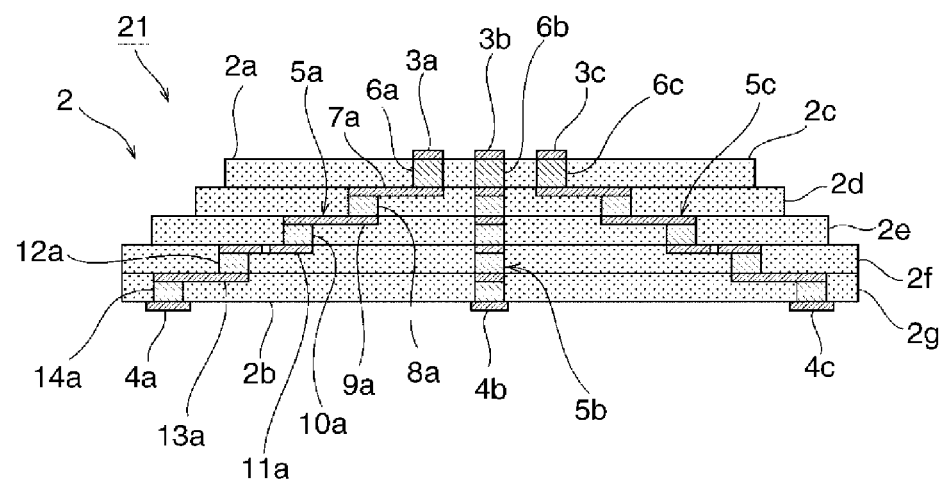
FIGS. 6(a) and 6(b) are each a schematic front sectional view illustrating another modification of the multilayer wiring substrate according to the first embodiment of the present invention.
Figure 6:
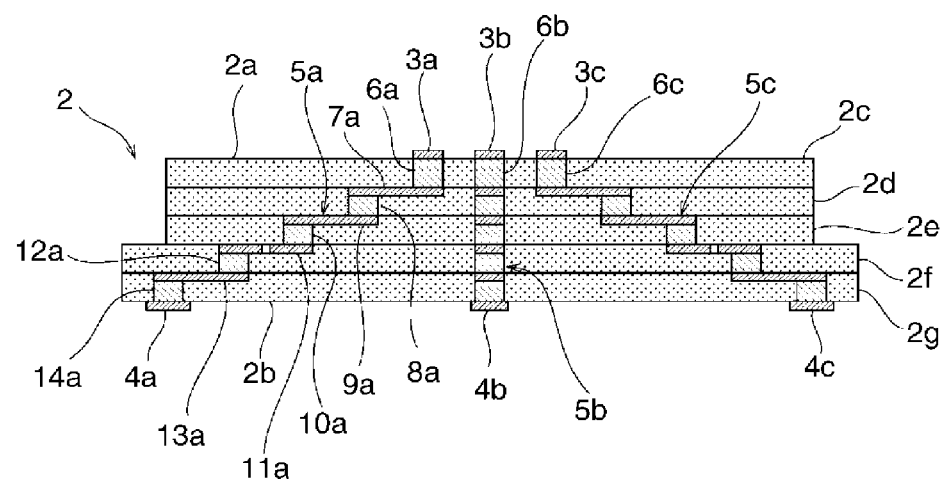

FIGS. 6(a) and 6(b) are each a schematic front sectional view illustrating another modification of the multilayer wiring substrate according to the first embodiment. In a multilayer wiring substrate 21 illustrated in FIG. 6(a), the first to third insulator layers 2c to 2e have smaller areas than the fourth and fifth insulator layers 2f and 2g. More specifically, the third insulator layer 2e has a smaller area than the fourth insulator layer 2f. The second insulator layer 2d and the first insulator layer 2c have even smaller areas decreasing in that order. In the first embodiment, as illustrated in FIG. 1(b), the interval between two adjacent ones of the plural wirings 5a to 5i spreads gradually as they extend from the first principal surface 2a toward the second principal surface 2b. In the first embodiment, therefore, a portion where the via conductors exist at a high density and a portion where no via conductors exist are present on the side closer to the first principal surface 2a. This gives rise to a risk that the substrate body may be waved due to the difference in density of the via conductors.

On the other hand, in the modification illustrated in FIG. 6(a), the insulator layer has a smaller area as the density of the via conductors arranged in each insulator layer increases. Accordingly, the difference in the density of the via conductors arranged in the insulator layers can be reduced among the insulator layers. As a result, the warping of the substrate in a firing step to manufacture the substrate body 2 can be suppressed more effectively.

While, in FIG. 6(a), the area of the insulator layer is gradually reduced in order from the third insulator layer 2e to the first insulator layer 2c, the insulator layers may be formed such that, as illustrated in FIG. 6(b), the first to third insulator layers 2c to 2e have the same area, which is smaller than the area of the fourth and fifth insulator layers 2f and 2g.

Figure 7:
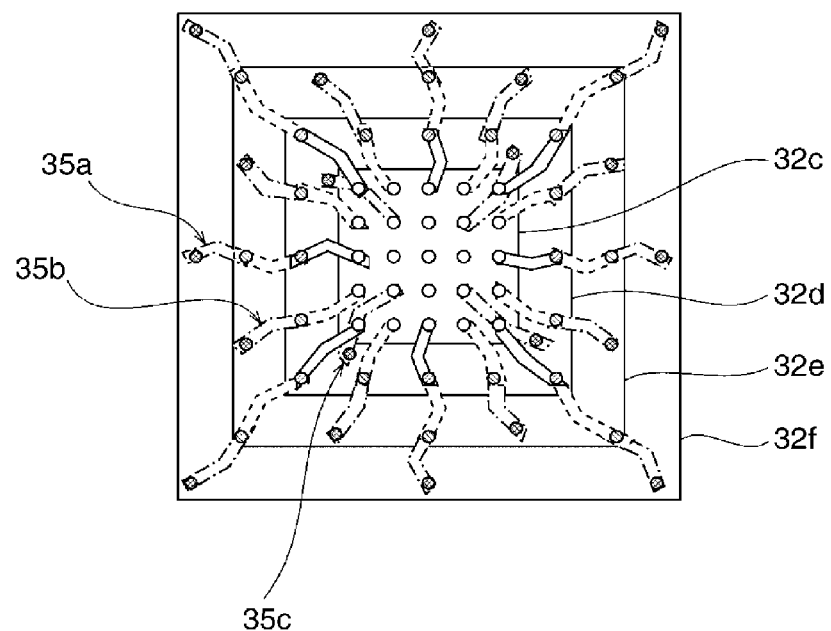
FIG. 7 is a schematic plan view to explain the layout of a plurality of wirings in a multilayer wiring substrate according to a second embodiment of the present invention.

FIG. 7 is a schematic plan view illustrating the layout of a plurality of wirings in a multilayer wiring substrate according to a second embodiment of the present invention. FIGS. 8(a) and 8(b) are each a schematic plan view to explain the positional relationships of via conductors and wiring conductors disposed in insulator layers in the second embodiment.

Figure 8:
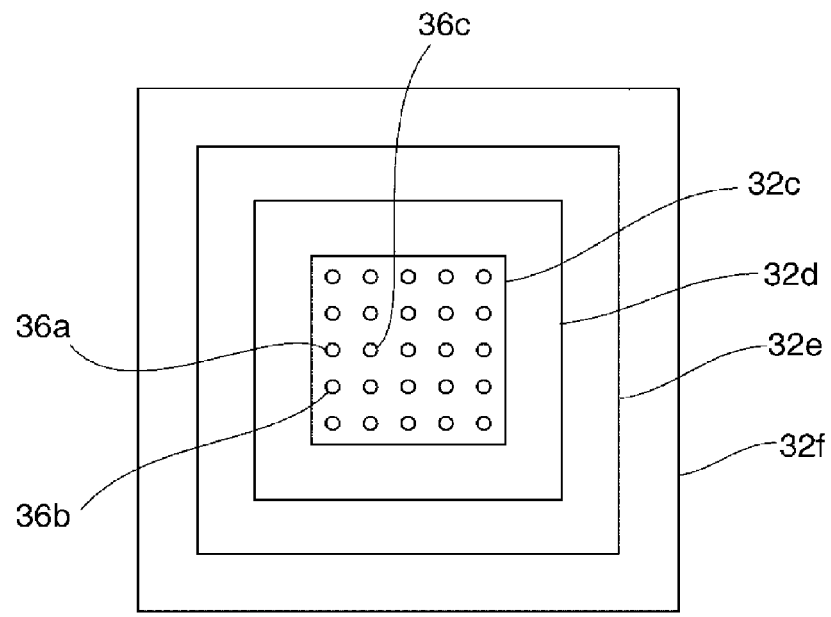
FIGS. 8(a) and 8(b) are each a schematic plan view to explain the arrangement of the plural wirings in the multilayer wiring substrate according to the second embodiment.
Figure 8:
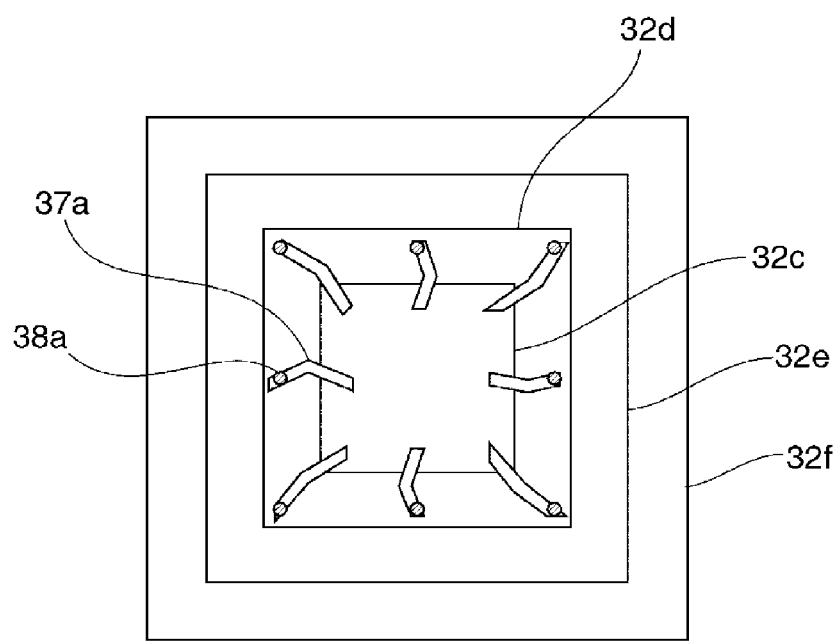
Figure 9:
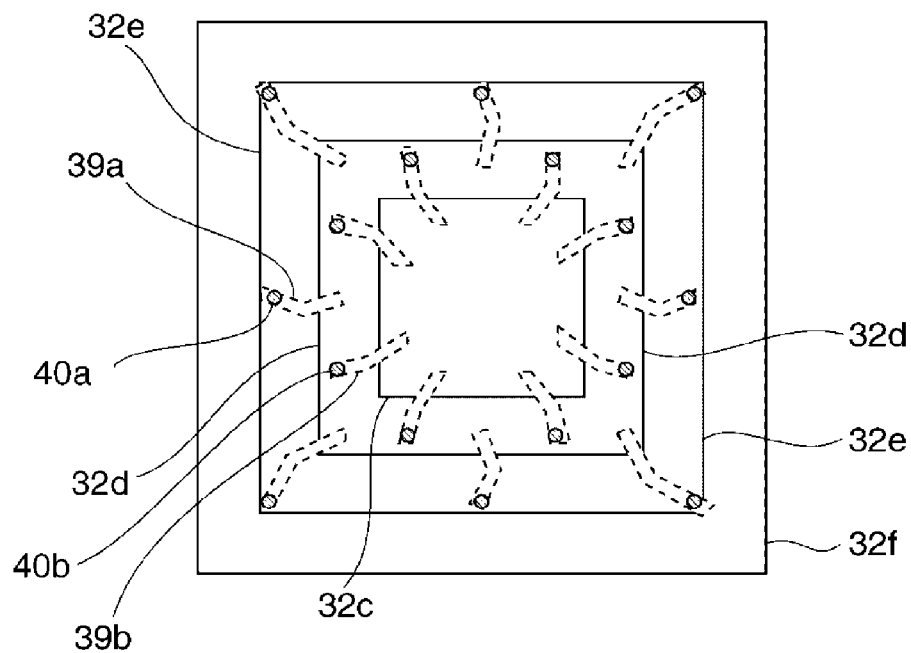
FIGS. 9(a) and 9(b) are each a schematic plan view to explain the arrangement of the plural wirings in the multilayer wiring substrate according to the second embodiment.
Figure 9:
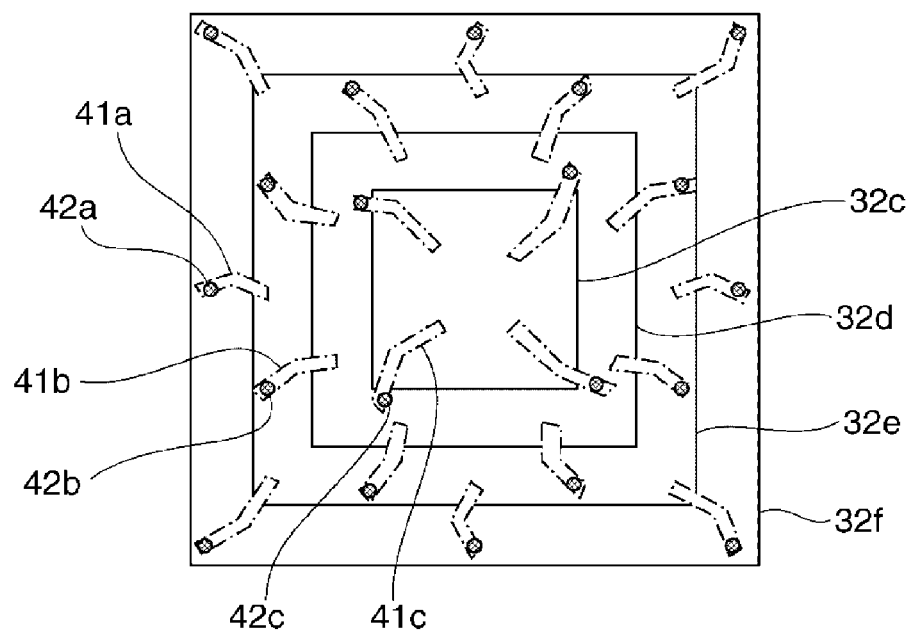

In this embodiment, the first to fourth insulator layers 32c to 32f are stacked as illustrated in simplified representation in FIG. 8(a). In FIGS. 8(a) to 9(b), as in FIGS. 3(a) to 4(b) described above, outer shapes of the plural insulator layers 32c to 32f are illustrated at different sizes from each other in order that the respective positions of the via conductors and the wiring conductors disposed in the different insulator layers are more clearly understood. In fact, the insulator layers 32c to 32f have the same area.

A plurality of via conductors 36a, 36b, 36c, etc. is disposed in a matrix-like pattern in the first insulator layer 32c. Of the plural via conductors disposed in the matrix-like pattern, the outer-peripheral via conductors 36a and 36b positioned at an outer periphery and the inner-peripheral via conductor 36c arranged in a region surrounded by the outer-peripheral via conductors will be described below as representative examples.

As illustrated in FIG. 8(b), a via conductor 38a and a wiring conductor 37a are disposed in the second insulator layer 32d. The wiring conductor 37a is connected to a lower end of the via conductor 36a. In other words, the lower end of the via conductor 36a, illustrated in FIG. 8(a), is electrically connected to the wiring conductor 37a disposed on the second insulator layer 32d. Also in this embodiment, the wiring conductor 37a has a nonlinear shape.

On the other hand, as illustrated in FIG. 9(a), a via conductor 40a and a wiring conductor 39a are disposed in the third insulator layer 32e. The wiring conductor 39a is disposed on the third insulator layer 32e and is connected to the via conductor 40a. The other end of the wiring conductor 39a is electrically connected to a lower end of the above-mentioned via conductor 38a.

Furthermore, a via conductor 40b is disposed in the third insulator layer 32e, and a wiring conductor 39b is disposed on the third insulator layer 32e. The via conductor 40b penetrates through the third insulator layer 32e, and it is connected to the wiring conductor 39b disposed on the third insulator layer 32e. The via conductor 36b, illustrated in FIG. 8(a), penetrates through not only the first insulator layer 32c, but also the second insulator layer 32d, and it is connected to the wiring conductor 39b.

The via conductor 36c, illustrated in FIG. 8(a), penetrates from the first insulator layer 32c to the third insulator layer 32e.

On the other hand, as illustrated in FIG. 9(b), a via conductor 42a is disposed in the fourth insulator layer 32f. The via conductor 42a penetrates through the fourth insulator layer 32f and reaches the second principal surface. The wiring conductor 41a is disposed on the fourth insulator layer 32f and is electrically connected to the via conductor 42a. The wiring conductor 41a is electrically connected to a lower end of the above-mentioned via conductor 40a illustrated in FIG. 9(a). The wiring 35a illustrated in FIG. 7 is thus constituted.

As described above, the via conductor 36b adjacent to the via conductor 36a in FIG. 8(a) penetrates through the second insulator layer 32d as well, and it is connected to the wiring conductor 39b disposed on the third insulator layer 32e. Furthermore, the via conductor 40b is connected to a wiring conductor 41b illustrated in FIG. 9(b). The wiring conductor 41b is formed on the fourth insulator layer 32f. A via conductor 42b penetrates through the fourth insulator layer 32f. The via conductor 42b reaches a lower surface of the fourth insulator layer 32f, i.e., the second principal surface. Thus, the wiring 35b illustrated in FIG. 7 is constituted by disposing the via conductor 36b, the wiring conductor 39b, the via conductor 40b, the wiring conductor 41b, and the via conductor 42b as described above.

As illustrated in FIG. 7, the via conductor 36a and the via conductor 36b, both being the outer-peripheral via conductors, are adjacent to each other, and the distance between the via conductors 36a and 36 is very short. In this embodiment, therefore, the wiring 35a including the via conductor 36a is formed such that the via conductor 36a is connected to the wiring conductor 37a disposed on the second insulator layer 32d. The adjacent via conductor 36b is electrically connected to the wiring conductor 39b disposed on the third insulator layer 32e. Thus, the adjacent via conductors 36a and 36b are electrically connected to the wiring conductors, which are disposed at different positions in height.

In this embodiment, because many via conductors are disposed in the first insulator layer 32c as illustrated in FIG. 7, adjacent ones of the outer-peripheral via conductors are electrically connected to the wiring conductors disposed at different positions in height. Therefore, the plural wirings can be constituted more easily. Also in this embodiment, the wiring conductors, e.g., the wiring conductors 37a, 39a, 41a, 39b and 41b, of the wirings 35a and 35b have nonlinear shapes. Accordingly, as in the first embodiment, it is possible to effectively relieve stress exerted from the outside, and to suppress the occurrence of cracks.

Of the plural via conductors exposed to the first principal surface, the inner-peripheral via conductor 36c surrounded by the outer-peripheral via conductors penetrates through not only the first insulator layer 32c, but also the second and third insulator layer 32d and 32e, and it reaches an upper surface of the fourth insulator layer 32f. The inner-peripheral via conductor 36c is electrically connected to a wiring conductor 41c disposed on the upper surface of the fourth insulator layer 32f. The wiring conductor 41c is connected to a via conductor 42c penetrating through the fourth insulator layer 32f. The wiring 35c is thus constituted.

Moreover, in this embodiment, the inner-peripheral via conductor 42c on the side close to the second principal surface, to which the inner-peripheral via conductor 36c is electrically connected, is positioned inward of the outer-peripheral via conductor 42a and 42b on the side close to the second principal surface to which the outer-peripheral via conductors 36a and 36b on the side close to the first principal surface are connected. In other words, the via conductor 42c is formed as the inner-peripheral via conductor on the side close to the second principal surface. Other inner-peripheral via conductors are also led out in a similar manner. Thus, many via conductors are arranged at sufficient intervals between them in the second principal surface. Accordingly, those many via conductors can be easily electrically connected to the outside.

In the present invention, as described above, the plural via conductors on the side close to the first principal surface may be electrically connected to the wiring conductors that are disposed at different positions in height. As a result, the wirings can be constituted such that many via conductors can be led out to the principal surface without difficulty.

Figure 10:
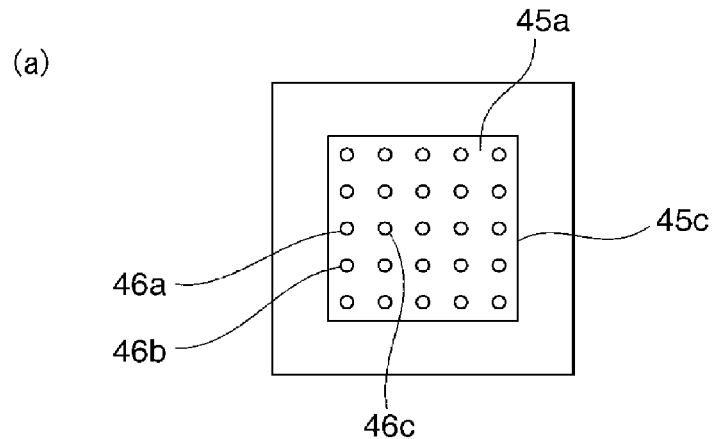
FIGS. 10(a) to 10(c) are each a schematic plan view to explain the arrangement of a plurality of wirings in a multilayer wiring substrate according to a third embodiment of the present invention.
Figure 10:
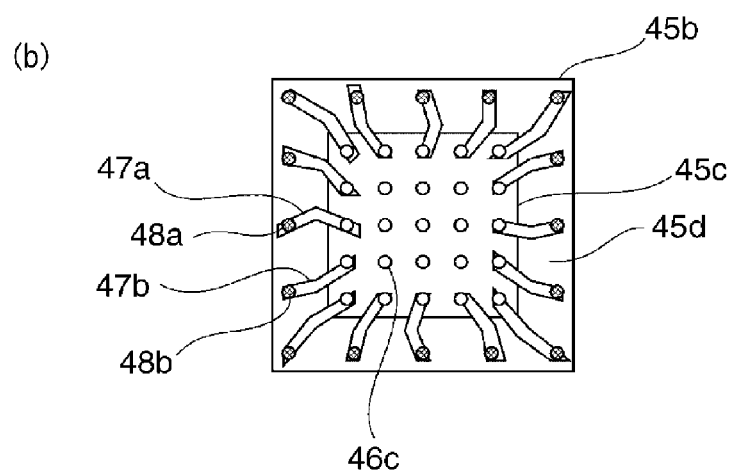
Figure 10:
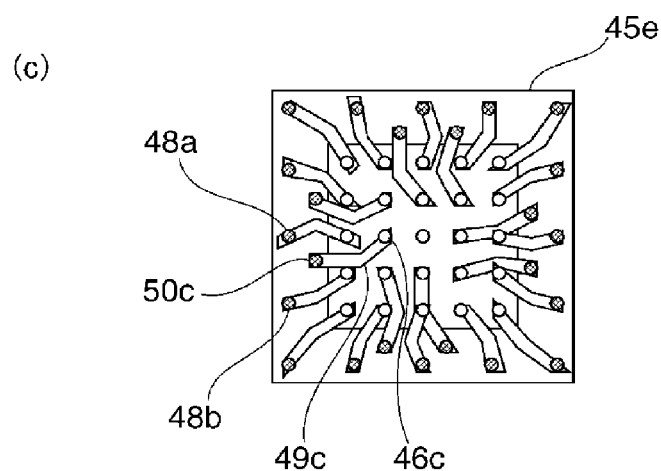

FIGS. 10(a) to 10(c) are each a schematic plan view to explain the arrangement of a plurality of wirings in a multilayer wiring substrate according to a third embodiment of the present invention. Also in this embodiment, as illustrated in FIG. 10(a), a plurality of via conductors is exposed in a matrix-like pattern to a first principal surface 45a. More specifically, FIG. 10(a) is a plan view of a first insulator layer 45c in which there are disposed a plurality of outer-peripheral via conductors 46a and 46b on the side close to the first principal surface and a plurality of inner-peripheral via conductors 46c on the side close to the first principal surface, which are arranged in a rectangular region surrounded by the outer-peripheral via conductors. FIG. 10(b) illustrates wiring conductors disposed on a second insulator layer 45d and via conductors penetrating through the second insulator layer 45d together with the via conductors penetrating through the first insulator layer 45c. The outer-peripheral via conductors 46a and 46b are connected to wiring conductors 47a and 47b disposed on the second insulator layer 45d, respectively. The wiring conductors 47a and 47b have non-linear shapes as in the first embodiment. Furthermore, the wiring conductors 47a and 47b are electrically connected to the via conductors 48a and 48b, respectively. The via conductors 48a and 48b are formed such that they penetrate through the second insulator layer 45d, and that, as illustrated in FIG. 10(c), they further penetrate through a third insulator layer 45e and reach a lower surface of the third insulator layer 45e. In this embodiment, the lower surface of the third insulator layer 45e defines the second principal surface.

Meanwhile, taking the inner-peripheral via conductor 46c as an example, the inner-peripheral via conductor 46c penetrates through not only the first insulator layer 45c, but also the second insulator layer 45d. The inner-peripheral via conductor 46c is then electrically connected to a wiring conductor 49c disposed on the third insulator layer 45e. The wiring conductor 49c is electrically connected to a via conductor 50c penetrating through the third insulator layer 45e. The via conductor 50c reaches the lower surface of the third insulator layer 45e, i.e., the second principal surface. Thus, the outer-peripheral via conductors 46a and 46b positioned on the outer peripheral side are connected to the outer-peripheral via conductors 48a and 48b on the side close to the second principal surface, respectively, which reach the lower surface of the insulator layer 45e. On the other hand, the inner-peripheral via conductor 46c is connected to the via conductor 50c, i.e., the inner-peripheral via conductor on the side close to the second principal surface, which is positioned in the second principal surface inward of the via conductors 48a and 48b, i.e., the outer-peripheral via conductors on the side close to the second principal surface. Accordingly, also in this embodiment, many via conductors on the side close to the first principal surface can be led out such that they are arranged at sufficient intervals between them in the second principal surface.

Figure 11:
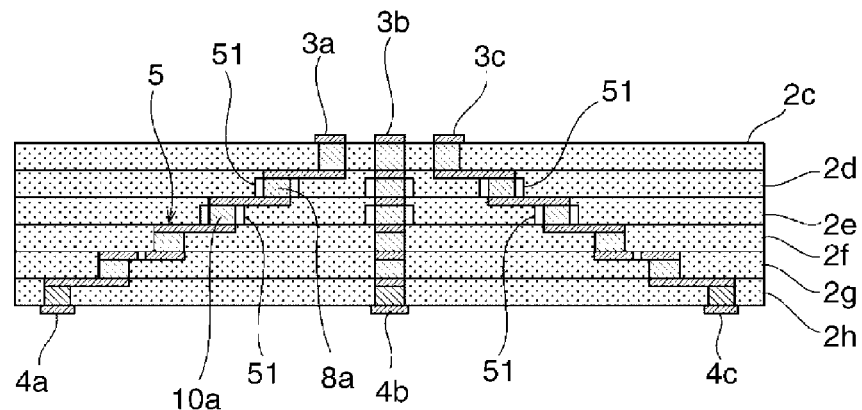
FIG. 11 is a schematic front sectional view to explain a multilayer wiring substrate according to a fourth embodiment of the present invention.

FIG. 11 is a schematic front sectional view to explain a multilayer wiring substrate according to a fourth embodiment of the present invention. The fourth embodiment is different from the first embodiment in that, in some of the via conductors, a gap is formed between the via conductor and an insulator layer, and that a sixth insulator layer 2h is further stacked. More specifically, taking a via conductor 8a in the second insulator layer 2d as an example, a gap 51 is formed around the via conductor 8a. The gap 51 is positioned between the via conductor 8a and the second insulator layer 2d. When looking at the gap 51 in a plan view, the gap 51 is formed in a frame-like shape surrounding the via conductor 8a. Additional gaps 51 are similarly formed for other via conductors that are positioned in the second insulator layer 2d and the third insulator layer 2e. With the gaps formed as described above, even when stress is exerted on the via conductor 8a, the stress is relieved through the gaps. Stated in another way, in the wiring 5a, the stress is effectively absorbed with the presence of the gaps 51.

The multilayer wiring substrate of the fourth embodiment is substantially the same as that of the first embodiment except for the provision of the gaps 51. Therefore, as in the first embodiment, it is possible to suppress the warping of the substrate, and to improve the flatness of the substrate surface. In addition, the occurrence of cracks can be more effectively suppressed with the presence of the gaps 51. The gaps 51 may be formed around all the via conductors. However, as in this embodiment, the gaps 51 are preferably not formed around the via conductors, which are positioned in the first insulator layer 2c and the sixth insulator layer 2h, the latter being positioned on the side close to the second principal surface. Such an arrangement is effective in suppressing degradation of resistance to moisture.

Figure 12:
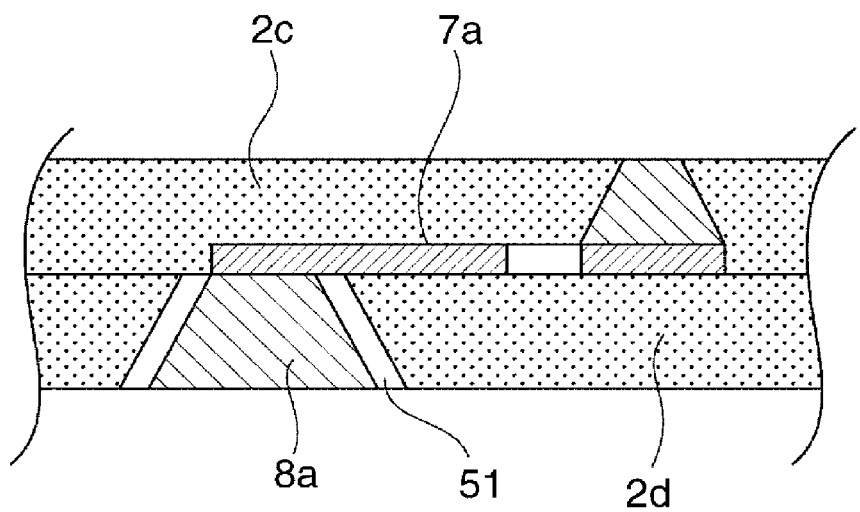
FIG. 12 is a schematic front sectional view illustrating a principal part of a multilayer wiring substrate according to a modification of the fourth embodiment of the present invention.

FIG. 12 is a schematic front sectional view illustrating principal part of a multilayer wiring substrate according to a modification of the fourth embodiment of the present invention. Also in this modified embodiment, as illustrated in FIG. 12, a gap 51 is formed between the via conductor 8a disposed in the second insulator layer 2d and the second insulator layer 2d. The via conductor 8a has a substantially trapezoidal shape in section. In other words, the sectional shape of the via conductor is not limited to particular one.

Figure 13:
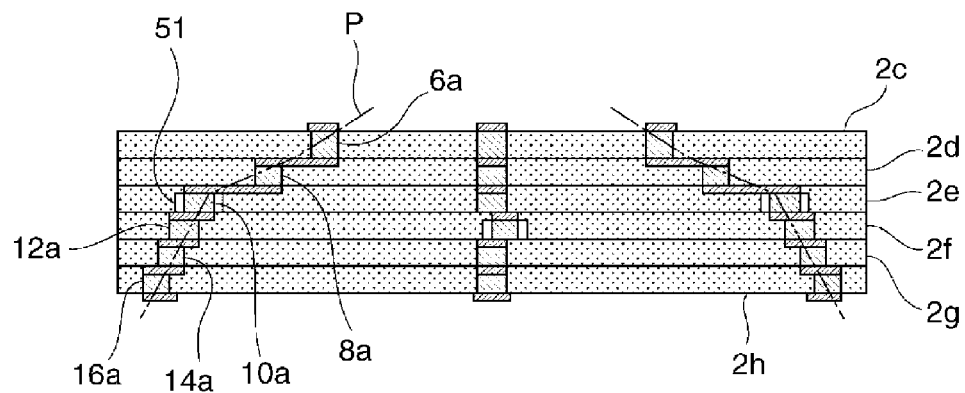
FIG. 13 is a schematic front sectional view illustrating a multilayer wiring substrate according to a fifth embodiment of the present invention.

FIG. 13 is a schematic front sectional view to explain a multilayer wiring substrate according to a fifth embodiment of the present invention. The fifth embodiment corresponds to a modification of the embodiment illustrated in FIG. 11. In the fifth embodiment, a wiring 5a includes via conductors 6a, 8a, 10a, 12a, 14a and 16a that are arranged as illustrated. Stated in another way, the wiring 5a is flexed as denoted by an imaginary line P. A gap 51 is formed around the via conductor 10a that is positioned in a portion where the wiring is flexed, i.e., at a flexion point of the wiring in the stacking direction. Thus, the gap 51 is desirably formed between the via conductor and the insulator layer, the via conductor being positioned at or near the flexion point of the wiring that extends in the stacking direction. Stress exerted from the outside tends to be applied to particularly the flexion point or thereabout. Accordingly, with the above-described arrangement that the gaps are formed around some particular via conductors, the stress exerted from the outside can be relieved more effectively.

Figure 14:
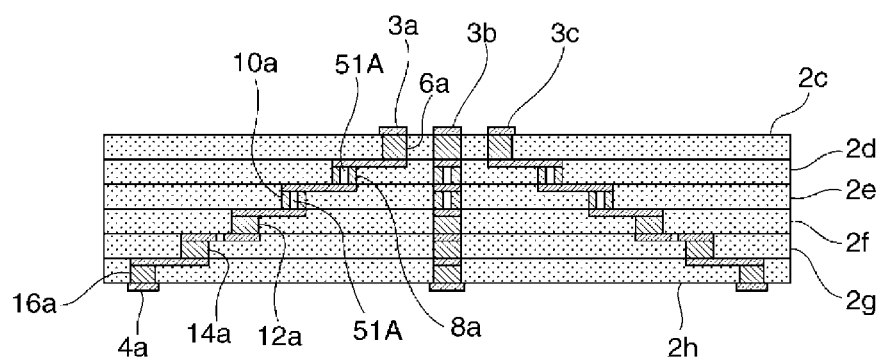
FIG. 14 is a schematic front sectional view of a multilayer wiring substrate according to a modification of the fourth embodiment of the present invention.
Figure 15:
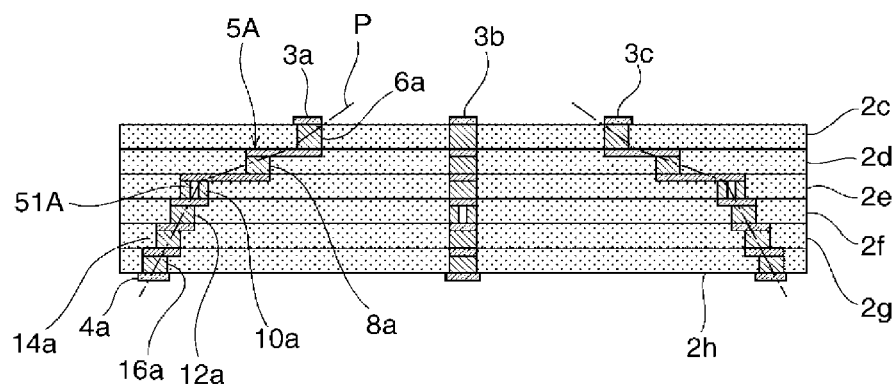
FIG. 15 is a schematic front sectional view illustrating a modification of a multilayer wiring substrate according to a modification of the fifth embodiment.

FIG. 14 is a schematic front sectional view of a multilayer wiring substrate according to a modification of the embodiment illustrated in FIG. 11. While the gaps 51 are formed around the via conductors 8a and 10a in FIG. 11, tubular gap 51A may be formed so as to penetrate respective centers of the via conductors 8a and 10a as illustrated in FIG. 14. Similarly, FIG. 15 is a schematic front sectional view of a multilayer wiring substrate according to a modification of the embodiment illustrated in FIG. 13. In this modification, a gap 51A is formed inside the via conductor 10a that is positioned at the flexion point of the wiring 5A. Thus, the gap serving to absorb stress may be formed between the outer periphery of the via conductor and the insulator layer, or inside the via conductor. In the embodiment in which the gap is formed for the via conductor positioned at the flexion point, the gap may be optionally formed, as in the above-described case, between the outer periphery of the via conductor and the insulator layer, or inside the via conductor.

Also in the embodiments and the modifications illustrated in FIGS. 11 to 14, since at least one of plural wiring conductors has a nonlinear shape similarly to the first embodiment, it is possible to suppress the warping of the substrate, to improve the flatness of the substrate surface, and to effectively suppress the occurrence of cracks as in the first embodiment.

1 . . . multilayer wiring substrate
2 . . . substrate body
2a . . . first principal surface
2b . . . second principal surface
2c . . . first insulator layer
2d . . . second insulator layer
2e . . . third insulator layer
2f . . . fourth insulator layer
2g . . . fifth insulator layer
2h . . . sixth insulator layer
3a to 3c . . . electrodes
4a to 4c . . . terminal electrodes
5A . . . wiring
5a to 5i . . . wirings
6a, 8a, 10a, 12a, 14a, 16a . . . via conductors
6b to 6i . . . via conductors
7a, 9a, 11a, 13a . . . wiring conductors
21 . . . multilayer wiring substrate
32c . . . first insulator layer
32d . . . second insulator layer
32e . . . third insulator layer
32f . . . fourth insulator layer
35a, 35b, 35c . . . wirings
36a, 36b, 36c . . . via conductors
37a, 39a, 39b, 41a, 41b . . . wiring conductors
37c . . . wiring conductor
38a . . . via conductor
39c . . . wiring conductor
40a . . . via conductor
40b . . . via conductor
41a . . . wiring conductor
41b . . . wiring conductor
41c . . . wiring conductor
42a, 42b, 42c . . . via conductors
45a . . . first principal surface
45c . . . first insulator layer
45d . . . second insulator layer
45e . . . third insulator layer
46a, 46b, 46c . . . via conductors
47a, 47b . . . wiring conductors
48a, 48b . . . via conductors
49c . . . wiring conductor
50c . . . via conductor
51 . . . gap
51A . . . gap

The invention claimed is:

1. A multilayer wiring substrate including a substrate body having first and second principal surfaces, and a plurality of wirings disposed inside the substrate body and extending from the first principal surface toward the second principal surface, wherein the first principal surface comprises a first exterior surface of the multilayer wiring substrate and the second principal surface comprises a second exterior surface of the multilayer wiring substrate that is opposite the first exterior surface of the multilayer wiring substrate, the substrate body includes a plurality of stacked insulator layers, the wirings include a plurality of via conductors penetrating through at least one of the insulator layers, and wiring conductors disposed between the insulator layers and connecting the via conductors to each other, and the wiring conductors included in at least one of the wirings have a nonlinear shape, a plurality of outer-peripheral via conductors in one of the insulator layers that is closer to the first principal surface than to the second principal surface, and a plurality of inner-peripheral via conductors in one of the insulator layers that is closer to the first principal surface than to the second principal surface, the inner-peripheral via conductors being disposed in a region surrounded by an outer periphery defined by the outer-peripheral via conductors in one of the insulator layers that is closer to the first principal surface than to the second principal surface, the one of the insulator layers having the first exterior surface, when seeing through the substrate body from a direction perpendicular to the second exterior surface, a region surrounded by the plurality of outer-peripheral via conductors in one of the insulator layers that is closer to the second exterior surface, which are positioned at second exterior surface-side end portions of the plurality of wirings including the plurality of outer-peripheral via conductors in one of the insulator layers that is closer to the first exterior surface than to the second principal surface, has a larger area than a region surrounded by the outer-peripheral via conductors in one of the insulator layers that is closer to the first exterior surface than to the second principal surface, and a plurality of inner-peripheral via conductors in one of the insulator layers that is closer to the second exterior surface than to the first principal surface, which are positioned at the second exterior surface-side end portions of the wirings including the inner-peripheral via conductors in one of the insulator layers that is closer to the first exterior surface than to the second principal surface, are positioned inside the region surrounded by the outer-peripheral via conductors in one of the insulator layers that is closer to the second exterior surface than to the first principal surface.

2. The multilayer wiring substrate according to claim 1, wherein the wiring conductors included in all of the wirings have a nonlinear shape.

3. The multilayer wiring substrate according to claim 2, wherein a distance between the wirings adjacent to each other increases as the wirings extend from the first principal surface toward the second principal surface.

4. The multilayer wiring substrate according to claim 2, wherein, when seeing through the substrate body in a direction perpendicular to the first principal surface, the plurality of via conductors of the wiring are not positioned on one linear line.

5. The multilayer wiring substrate according to claim 2, wherein one of the via conductors and another of the via conductors, which are adjacent to each other in one of the insulator layers in a direction parallel to the first principal surface, are connected to the wiring conductors disposed in different ones of the insulator layers.

6. The multilayer wiring substrate according to claim 1, wherein the wirings are disposed to extend from the first principal surface up to the second principal surface.

7. The multilayer wiring substrate according to claim 6, wherein a distance between the wirings adjacent to each other increases as the wirings extend from the first principal surface toward the second principal surface.

8. The multilayer wiring substrate according to claim 7, wherein, in comparison with an area of at least one of the insulator layers which is positioned to be closer to the second principal surface than to the first principal surface, at least one of the insulator layers, which is positioned to be closer to the first principal surface than the at least one insulator layers which is positioned to be closer to the second principal surface, has a smaller area than the at least one of the insulator layers which is positioned to be closer to the second principal surface than to the first principal surface.

9. The multilayer wiring substrate according to claim 7, wherein, when seeing through the substrate body in a direction perpendicular to the first principal surface, the plurality of via conductors of the wiring are not positioned on one linear line.

10. The multilayer wiring substrate according to claim 6, wherein a distance between the wirings adjacent to each other increases as the wirings extend from the first principal surface toward the second principal surface.

11. The multilayer wiring substrate according to claim 6, wherein, when seeing through the substrate body in a direction perpendicular to the first principal surface, the plurality of via conductors of the wiring are not positioned on one linear line.

12. The multilayer wiring substrate according to claim 1, wherein, when seeing through the substrate body in a direction perpendicular to the first principal surface, the plurality of via conductors of the wiring are not positioned on one linear line.

13. The multilayer wiring substrate according to claim 1, wherein one of the via conductors and another of the via conductors, which are adjacent to each other in one of the insulator layers in a direction parallel to the first principal surface, are connected to the wiring conductors disposed in different ones of the insulator layers.

14. The multilayer wiring substrate according to claim 13, wherein one surface of the one of the insulator layers defines the first principal surface of the substrate body.

15. The multilayer wiring substrate according to claim 1, wherein each of the wiring conductors includes a first linear portion and a second linear portion that is continuously joined to one end of the first linear portion and that extends in a direction intersecting the first linear portion.

16. The multilayer wiring substrate according to claim 1, wherein each of the wiring conductors has a curved shape.

17. The multilayer wiring substrate according to claim 1, wherein, for at least one of the via conductors, a gap is formed between at least one of the via conductors and at least one of the insulator layers.

18. The multilayer wiring substrate according to claim 17, wherein the gap is formed for any of the via conductors that is positioned at a flexion point of each of the wiring conductors in a stacking direction of the insulator layers.

19. The multilayer wiring substrate according to claim 1, wherein a gap is formed inside at least one of the via conductors.

* * * * *